United States Patent
Geissler et al.

(10) Patent No.: US 9,056,763 B2
(45) Date of Patent: Jun. 16, 2015

(54) STRESS BUFFER LAYER FOR INTEGRATED MICROELECTROMECHANICAL SYSTEMS (MEMS)

(71) Applicants: Christian Geissler, Teugn (DE); Thorsten Meyer, Regensburg (DE); Gerald Ofner, Regensburg (DE); Reinhard Mahnkopf, Oberhaching (DE); Andreas Augustin, Munich (DE); Christian Mueller, Bottrop (DE)

(72) Inventors: Christian Geissler, Teugn (DE); Thorsten Meyer, Regensburg (DE); Gerald Ofner, Regensburg (DE); Reinhard Mahnkopf, Oberhaching (DE); Andreas Augustin, Munich (DE); Christian Mueller, Bottrop (DE)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/039,157

(22) Filed: Sep. 27, 2013

(65) Prior Publication Data

US 2015/0091167 A1 Apr. 2, 2015

(51) Int. Cl.
*H01L 23/02* (2006.01)
*B81C 1/00* (2006.01)
*B81B 7/00* (2006.01)

(52) U.S. Cl.
CPC ........... *B81C 1/00261* (2013.01); *B81B 7/0045* (2013.01); *B81B 2203/04* (2013.01); *B81C 2203/0154* (2013.01)

(58) Field of Classification Search
USPC .......... 257/678, 685, 687, 709, E23.001, 415, 257/417, 418, 253, 254
See application file for complete search history.

(56) References Cited

U.S. PATENT DOCUMENTS

| 2007/0152318 A1* | 7/2007 | Chiang et al. ................. 257/687 |
| 2008/0132006 A1* | 6/2008 | Jiang et al. .................... 438/123 |
| 2012/0049375 A1* | 3/2012 | Meyer et al. .................. 257/773 |

* cited by examiner

*Primary Examiner* — Timor Karimy
(74) *Attorney, Agent, or Firm* — Blakely, Sokoloff, Taylor & Zafman LLP

(57) ABSTRACT

Stress buffer layers for integrated microelectromechanical systems (MEMS) are described. For example, a semiconductor package includes a substrate having first and second surfaces, the second surface having an array of external conductive contacts. A microelectromechanical system (MEMS) component is disposed above the first surface of the substrate. A buffer layer is disposed above the MEMS component, the buffer layer having a first Young's modulus. A mold compound is disposed above the buffer layer, the mold compound having a second Young's modulus higher than the first Young's modulus.

35 Claims, 8 Drawing Sheets

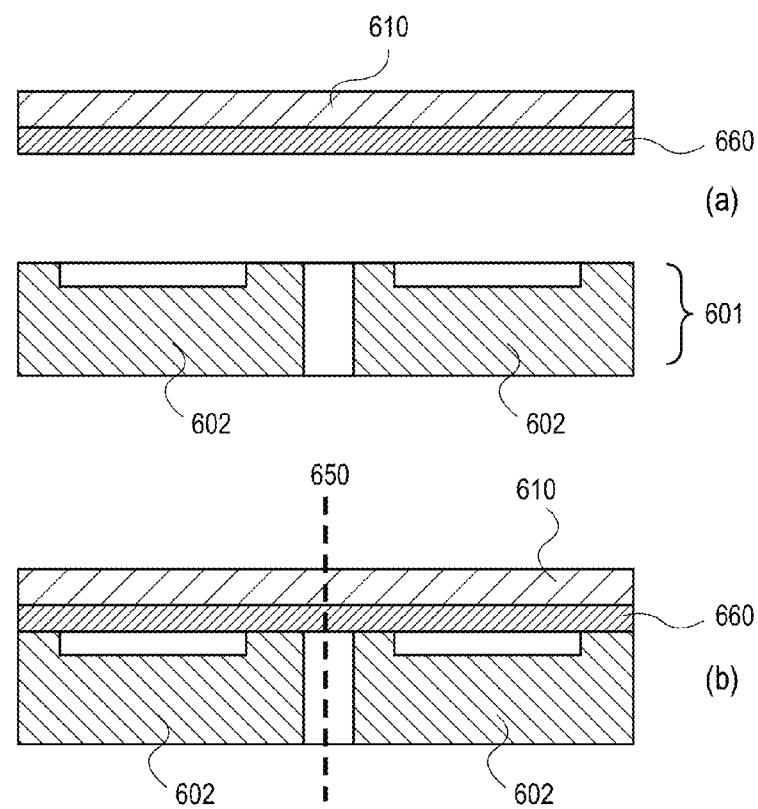
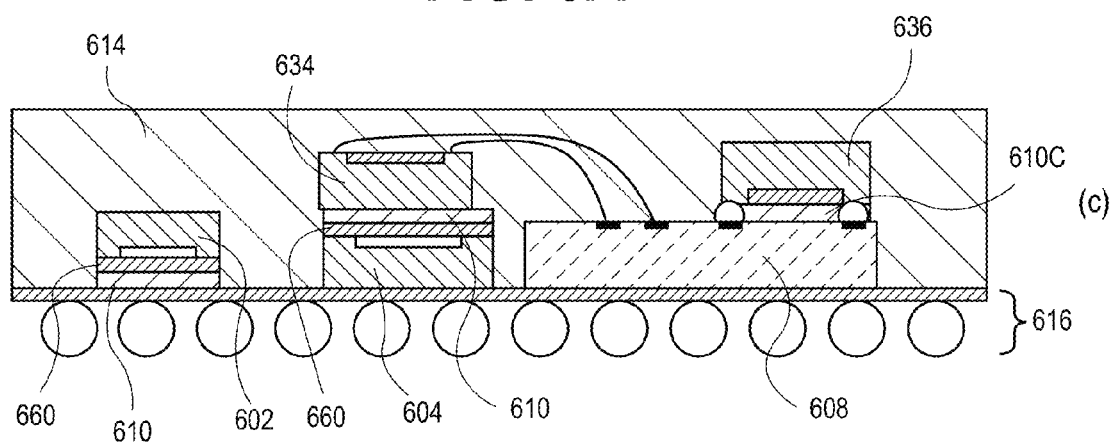
FIG. 6A
FIG. 6B

STRESS BUFFER LAYER FOR INTEGRATED MICROELECTROMECHANICAL SYSTEMS (MEMS)

TECHNICAL FIELD

Embodiments of the invention are in the field of semiconductor packages and, in particular, stress buffer layers for integrated microelectromechanical systems (MEMS).

BACKGROUND

Today's consumer electronics market frequently demands complex functions requiring very intricate circuitry. Scaling to smaller and smaller fundamental building blocks, e.g. transistors, has enabled the incorporation of even more intricate circuitry on a single die with each progressive generation. Semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. For example, some semiconductor packages now use a coreless substrate, which does not include the thick resin core layer commonly found in conventional substrates. Furthermore, the demand for higher performance devices results in a need for an improved semiconductor package that enables a thin packaging profile and low overall warpage compatible with subsequent assembly processing.

Furthermore, for the past several years, microelectromechanical systems (MEMS) structures have been playing an increasingly important role in consumer products. For example, MEMS devices, such as sensors and actuators, can be found in products ranging from inertial sensors for air-bag triggers in vehicles to micro-mirrors for displays in the visual arts industry and, more recently, in mobile applications such as air pressure sensors for altitude sensing. As these technologies mature, the demands on precision and functionality of the MEMS structures have escalated. For example, optimal performance may depend on the ability to fine-tune the characteristics of various components of these MEMS structures. Furthermore, consistency requirements for the performance of MEMS devices (both intra-device and device-to-device) often dictates that the processes used to fabricate such MEMS devices need to be extremely sophisticated.

Although packaging scaling is typically viewed as a reduction in size, the addition of functionality in a given space is also considered. However, structural issues may arise when attempting to package semiconductor die with additional functionality also housed in the package. For example, the addition of packaged MEMS devices may add functionality, but ever decreasing space availability in a semiconductor package may provide obstacles to adding such functionality.

BRIEF DESCRIPTION OF THE DRAWINGS

FIGS. 6A and 6B illustrate cross-sectional views of a variety of MEMS device packaging operations using a buffer layer, in accordance with another embodiment, of the present invention.

DESCRIPTION OF THE EMBODIMENTS

Figure 1:
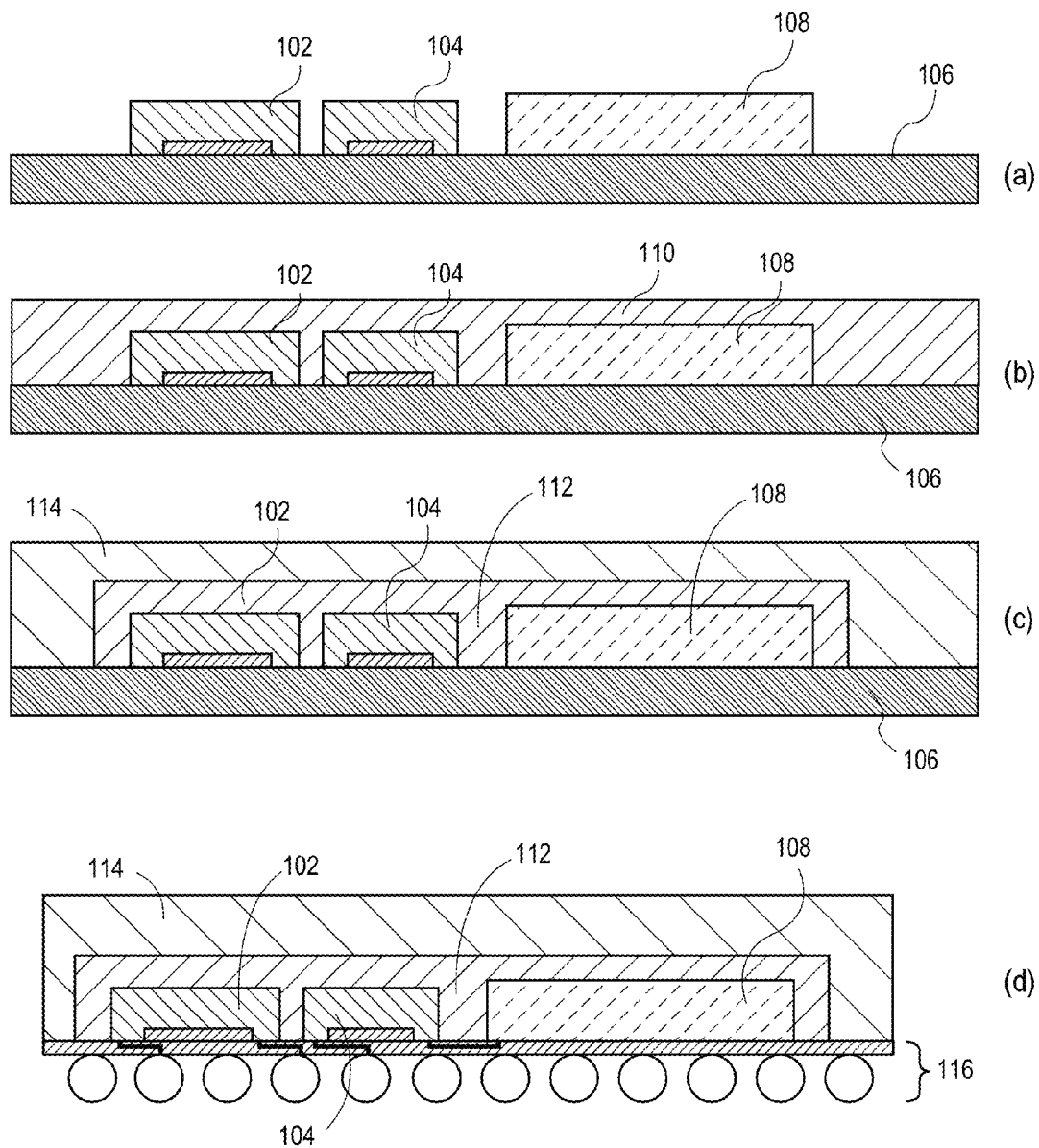
FIG. 1 illustrates cross-sectional views of a variety of MEMS device packaging operations using a buffer layer, in accordance with an embodiment, of the present invention.

Stress buffer layers for integrated microelectromechanical systems (MEMS) are described. In the following description, numerous specific details are set forth, such as packaging architectures, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to the inclusion of a buffer layer between packaged microelectromechanical systems (MEMS) devices. To provide a general context, MEMS components are a field of growth in the global semiconductor market. Numerous MEMS components and sensors are presently used in the mobile phone and tablet industry. However, form factor and cost reduction increases the demand for integrated package approaches. The inertial measurement unit (IMU) solutions involve multiple different MEMS components. However, miniaturization and three-dimensional integration of different types of MEMS components can lead to mechanical interactions between the individual MEMS components, which may reduce accuracy and sensitivity of such single components. Additionally, many MEMS components and sensors are sensitive to mechanical and thermo-mechanical stresses. In order to address such issues, one or more embodiments are directed to introduction of a stress buffer layer for integrated MEMS to avoid mechanical component interactions.

More specifically, MEMS components are typically placed side by side on one substrate. In order to facilitate compatibility between several MEMS devices, in accordance with an embodiment of the present invention, an additional stress buffer layer is provided during the packaging of such devices. Embodiments described herein may be practical for embedded wafer level ball grid array (eWLB) packaging technology for integrated circuits. In such packaging arrangements, the package interconnects are applied on an artificial wafer made of silicon chips and a casting compound. It is to be understood, however, that other similar packaging applications may be used as well.

As described below in a variety of exemplary embodiments, one or more embodiments involves the use an additional buffer layer between single or individual MEMS components inside of a single semiconductor package. The buffer layer can be used to avoid mechanical interaction between the MEMS within the single package. MEMS are placed side-by-side or stacked, examples of which are described below. To ensure high accuracy of small MEMS using mechanical components, it may be important to avoid mechanical interaction to neighboring MEMS or other dies. In accordance with an embodiment of the present invention, a buffer layer having a smaller Young's modulus than the Young's modulus of a corresponding eWLB mold compound which covers the dies is used. Typical values for mold compounds are 25 GPa, and buffer layer suitable materials may be in the range of 5 GPa or less, and in a particular embodiment 3 GPa or less. For example, in a specific embodiment, a low temperature curing polyimide (~2.5 GPa), epoxy, epoxy blends or silicone (<<1 GPa) can be used as a buffer layer in embodiments described herein. In other embodiments, flexibilized materials, e.g. polymers filled with flexibilizers such as silicones or polyurethanes can be used to provide such buffering.

In a first aspect, a buffer layer is deposited after placing components for packaging side by side on a receiving carrier (e.g., on a mold carrier for eWLB) or on a flip chip (FC) or wire bond (WB) substrate. For example, FIG. 1 illustrates cross-sectional views of a variety of MEMS device packaging operations using a buffer layer, in accordance with an embodiment, of the present invention. Referring to part (a) of FIG. 1, MEMS components 102 and 104 are placed onto a mold carrier (eWLB) or a substrate (FC, WB) 106. Other components such as an application-specific integrated circuit (ASIC) 108 are also placed on the carrier or substrate 106. Referring to part (b) of FIG. 1, a buffer 110 is applied to the structure of part (a). The buffer layer can be formed, for example, by dispensing, molding, lamination or printing. In one such embodiment, a soft material is used for the embedding of the dies. In the case of side-by-side placement, the components 102, 104 and 108 can each be protected by buffer layer 110 on five sides or just on the exposed top or bottom side. Referring to part (c) of FIG. 1, the buffer layer 110 is patterned, structured or cut away to form patterned buffer layer 112. A rigid mold compound 114 is then formed over the resulting structure. Referring to part (d) of FIG. 1, in the case of a carrier 106, the molded components are transferred to a ball grid array (BGA) substrate 116 or like receiving structure. Thus, completion of an eWLB assembly process may be performed, a general example of which is described in greater detail below. Such an arrangement may be referred to as a co-embedded side-by-side packaging arrangement. The MEMS components 102 and 104 can be of a same or different type, examples of which are described in greater detail below.

Figure 2:
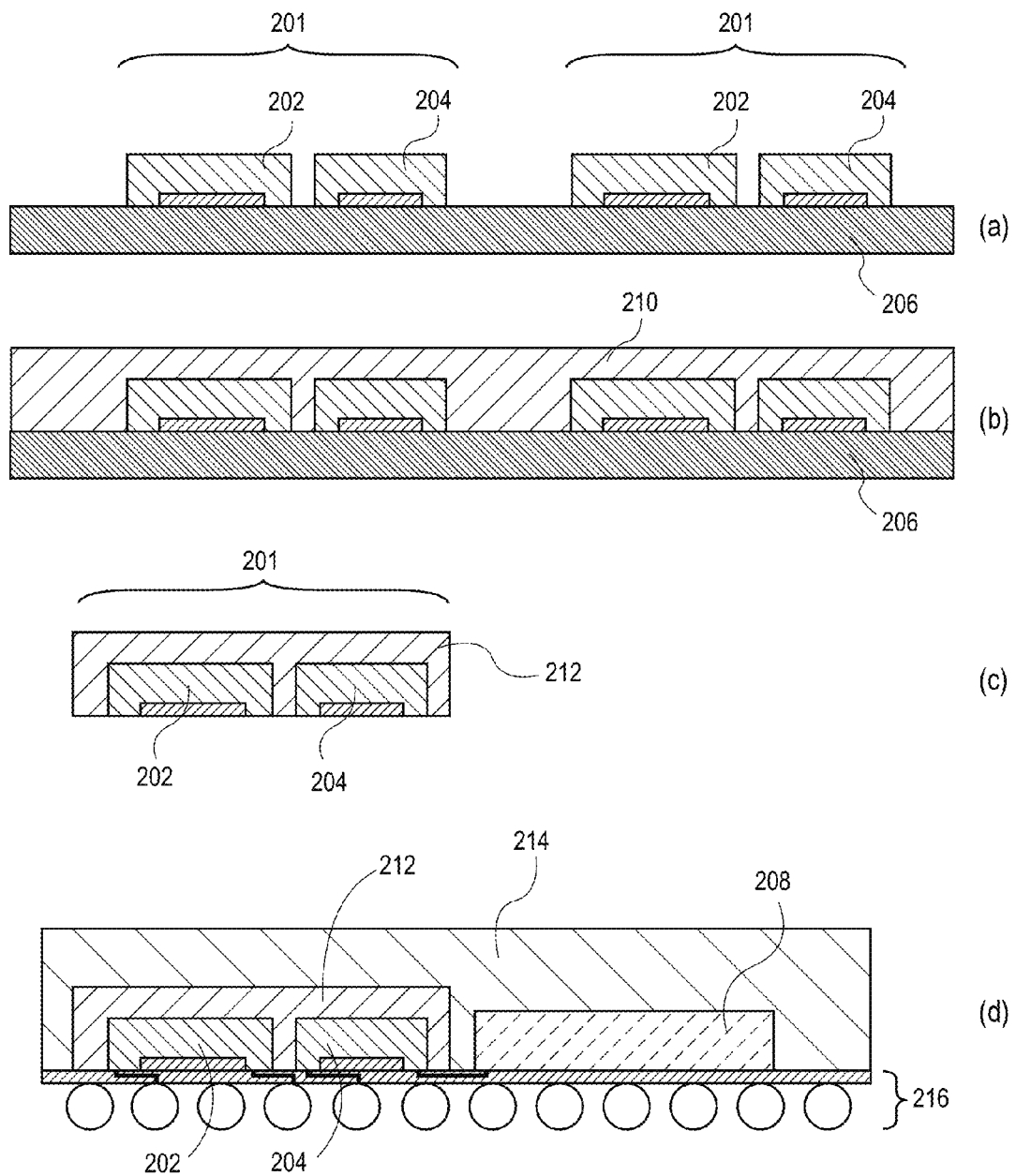
FIG. 2 illustrates cross-sectional views of a variety of MEMS device packaging operations using a buffer layer, in accordance with another embodiment, of the present invention.

With reference again to FIG. 1, although as depicted as such, it is to be understood that not all components need be embedded in the same material or in a material having a same property. In a second aspect, the components may instead be pre-embedded. In one such embodiment, a buffer layer is applied to a MEMS wafer backside prior dicing, e.g., in a case where the MEMS is only buffered on a backside. If, however, buffering on five sides is needed, the eWLB principle of embedding can be used with a soft buffer material instead of the highly filled, rigid mold compound. Following separation through the buffer material, a buffer layer remains including at the edges of the MEMS components. As an example, FIG. 2 illustrates cross-sectional views of a variety of MEMS device packaging operations using a buffer layer, in accordance with another embodiment, of the present invention. Referring to part (a) of FIG. 2, sets 201 of MEMS components 202 and 204 are placed onto a carrier 206. Referring to part (b) of FIG. 2, a buffer 210 is applied to the structure of part (a). Referring to part (c) of FIG. 2, the buffer layer 210 is patterned, structured or cut away to form patterned buffer layer 212 including only one set 201 of MEMS devices 202 and 204. Additionally, the set 201 is removed from the carrier 206, as is also depicted in part (c) of FIG. 2. Referring to part (d) of FIG. 2, the structure of part (c) is transferred to a ball grid array (BGA) substrate 216 or like receiving structure. A rigid mold compound 214 is then formed over the resulting structure the structure of part (c) along with additional devices, such as ASIC 208, above the BGA substrate 216. Thus, completion of an eWLB assembly process may be performed, a general example of which is described in greater detail below. Such an arrangement may be referred to as a pre-embedded side-by-side packaging arrangement. The MEMS components 202 and 204 can be of a same or different type, examples of which are described in greater detail below.

Figure 3:
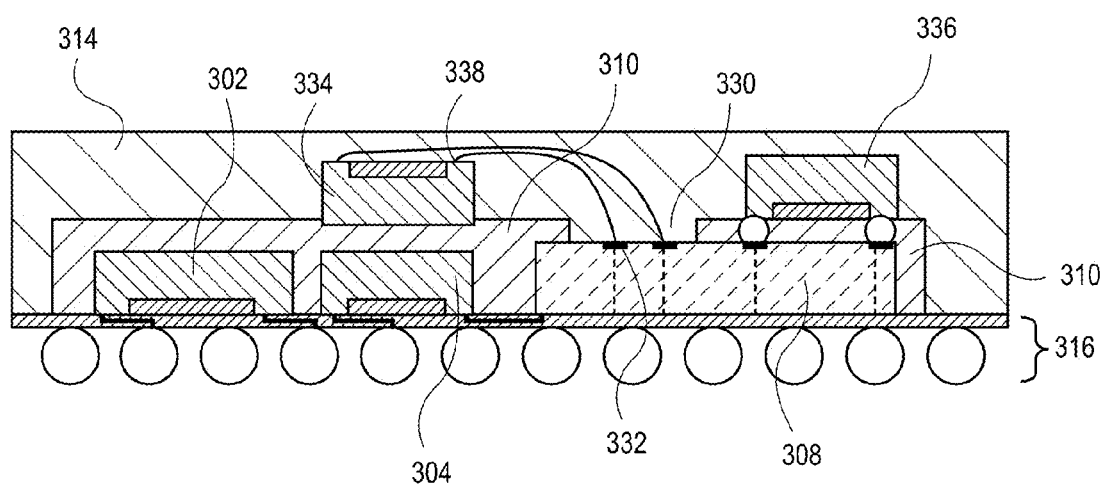
FIG. 3 illustrates a cross-sectional view of a package including a MEMS device and having stacked components, in accordance with another embodiment, of the present invention.

With reference again to FIGS. 1 and 2, although as depicted as such, it is to be understood that not all components need be placed side-by-side on a receiving carrier or substrate. In a third aspect, in cases of component stacking, the buffer layer may be structured, e.g. by exposure or laser, to allow access for contact to underlying die, to a redistribution layer, or to a substrate. In a first such example, FIG. 3 illustrates a cross-sectional view of a package including a MEMS device and having stacked components, in accordance with another embodiment, of the present invention. Referring to FIG. 3, MEMS components 302 and 304 and other components such as an application-specific integrated circuit (ASIC) 308 are disposed on a ball grid array (BGA) substrate 316 or like receiving structure. A buffer layer 310 is disposed on and surrounding the MEMS components 302 and 304 and the ASIC 308. However, the buffer layer is patterned, structured or cut away to provide an opening 330, exposing contact pads 332 of the ASIC 308. Additional MEMS components 334 and 336 are included above the plane including MEMS components 302 and 304 and the ASIC 308, i.e., the MEMS components 334 and 336 are stacked. In one such embodiment, contacts 338 of MEMS component 334 is wire bonded to the contact pads 332 of the ASIC 308, as depicted in FIG. 3. Referring again to FIG. 3, a rigid mold compound 314 is disposed over the MEMS components 302, 304, 334 and 336 and the ASIC 308. Thus, an eWLB assembly process may be performed, a general example of which is described in greater detail below. Such an arrangement may be fabricated by opening the buffer layer 310 by exposure or laser and may be used to enable connecting stacked MEMS to ASIC or other MEMS by wirebonds or solder balls or Cu-pillars, etc. The MEMS components 302, 304, 334 and 336 can be of a same or different type, examples of which are described in greater detail below.

Figure 4:
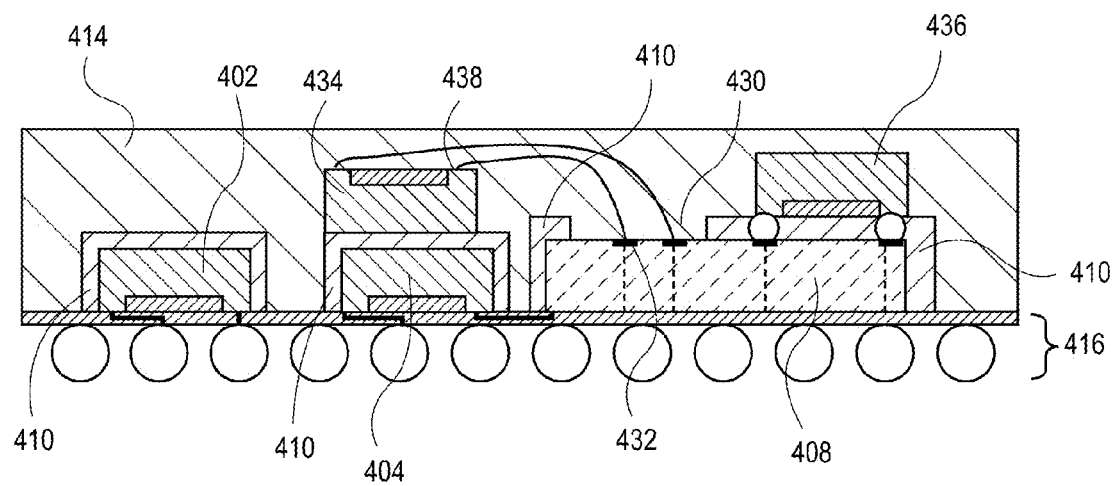
FIG. 4 illustrates a cross-sectional view of another package including a MEMS device and having stacked components, in accordance with another embodiment, of the present invention.

In a second such example, FIG. 4 illustrates a cross-sectional view of another package including a MEMS device and having stacked components, in accordance with another embodiment, of the present invention. Referring to FIG. 4, MEMS components 402 and 404 and other components such as an application-specific integrated circuit (ASIC) 408 are disposed on a ball grid array (BGA) substrate 416 or like receiving structure. A buffer layer 410 is disposed on and surrounding the MEMS components 402 and 404 and the ASIC 408. However, the buffer layer is patterned, structured or cut away to be discrete for each device and to provide an opening 430, exposing contact pads 432 of the ASIC 408. Additional MEMS components 434 and 436 are included above the plane including MEMS components 402 and 404 and the ASIC 408, i.e., the MEMS components 434 and 436 are stacked. In one such embodiment, contacts 438 of MEMS component 434 is wire bonded to the contact pads 432 of the ASIC 408, as depicted in FIG. 4. Referring again to FIG. 4, a rigid mold compound 414 is disposed over the MEMS components 402, 404, 434 and 436 and the ASIC 408. Thus, an eWLB assembly process may be performed, a general example of which is described in greater detail below. Such an arrangement may be fabricated by opening the buffer layer 410 by exposure or laser and may be used to enable connecting stacked MEMS to ASIC or other MEMS by wirebonds or solder balls or Cu-pillars, etc. With comparison to FIG. 3, the buffer layer 410 may be generated to be thinner than buffer layer 310 during original formation of the buffer layer 410 or through thinning of the buffer layer 410, ultimately forming a discrete portion of the buffer layer 410 for each of the components. The MEMS components 402, 404, 434 and 436 can be of a same or different type, examples of which are described in greater detail below.

Figure 5:
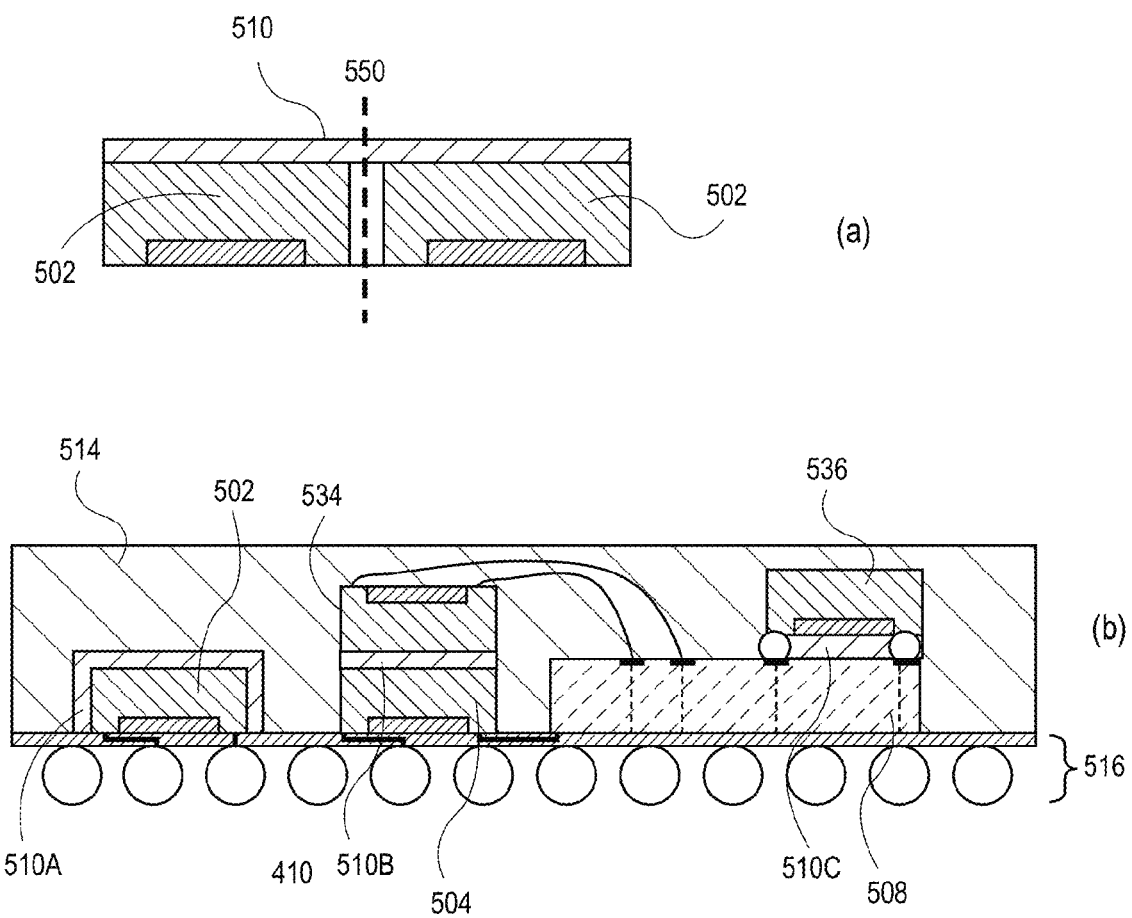
FIG. 5 illustrates cross-sectional views of a variety of MEMS device packaging operations using a buffer layer, in accordance with another embodiment, of the present invention.

In a fourth aspect, a buffer layer is formed on the backside of critical MEMS components prior to placing into a package. As an example, FIG. 5 illustrates cross-sectional views of a variety of MEMS device packaging operations using a buffer layer, in accordance with another embodiment, of the present invention. Referring to part (a) of FIG. 5, a stress buffer layer 510 is disposed on MEMS dies 502 on the backside of the MEMS die or on the MEMS-wafer. The MEMS dies 502 may be singulated 550 prior to or subsequent to forming the buffer layer 510. In the former case, in one such embodiment, the buffer layer 510 may also surround the MEMS components 502 on multiple sides. In the latter case, in one such embodiment, MEMS components 502 are embedded in soft buffer layer material on the wafer level and diced. Part (b) of FIG. 5 includes MEMS dies of both types. Referring to part (b) of FIG. 5, MEMS components 502 and 504 and other components such as an application-specific integrated circuit (ASIC) 508 are disposed on a ball grid array (BGA) substrate 516 or like receiving structure. A first buffer layer 510A is disposed on and surrounding the MEMS component 502. However, a second buffer layer 510B is disposed only along the top surface of the MEMS component 504. An additional MEMS component 534 is included above the plane including MEMS components 502 and 504 and the ASIC 508, i.e., the MEMS component 534 is stacked. In one such embodiment, MEMS component 534 is stacked on the MEMS component 504 with second buffer layer 510B disposed there between, as depicted in FIG. 5. Additionally, another MEMS component 536 is included above the plane including MEMS components 502 and 504 and the ASIC 508, i.e., the MEMS component 536 is also stacked. In one such embodiment, MEMS component 536 is stacked on the ASIC 508 with a third buffer layer 510C disposed there between, as is also depicted in FIG. 5. Referring again to part (b) of FIG. 5, a rigid mold compound 514 is disposed over the MEMS components 502, 504, 534 and 536 and the ASIC 508. Thus, an eWLB assembly process may be performed, a general example of which is described in greater detail below. The MEMS components 502, 504, 534 and 536 can be of a same or different type, examples of which are described in greater detail below.

In a fifth aspect, a buffer layer is included as part of a cap wafer, e.g., the buffer layer material is formed directly on a cap wafer. In an example, FIGS. 6A and 6B illustrate cross-sectional views of a variety of MEMS device packaging operations using a buffer layer, in accordance with another embodiment, of the present invention. Referring to part (a) of FIG. 6A, a buffer layer 610 is disposed on a cap wafer 660. The combined buffer layer 610/cap wafer 660 is placed on a MEMS wafer 601 including MEMS components 602. Referring to part (b) of FIG. 6A, the resulting structure is diced to singulate 650 the MEMS devices 602 having a buffer layer 610 and intervening cap portion 660. Referring to FIG. 6B, discrete dies from FIG. 6A may be included in a larger package. For example, as shown, MEMS components 602 and 604 and other components such as an application-specific integrated circuit (ASIC) 608 are disposed on a ball grid array (BGA) substrate 616 or like receiving structure. MEMS component 602 is coupled to the BGA substrate 616 by an underlying cap layer 660/buffer layer 610 pairing. By contrast, MEMS component 604 has an overlying cap layer 660/buffer layer 610 pairing. An additional MEMS component 634 is included above the plane including MEMS components 602 and 604 and the ASIC 608, i.e., the MEMS component 634 is stacked. In one such embodiment, MEMS component 634 is stacked on the MEMS component 604 with the overlying cap layer 660/buffer layer 610 pairing disposed there between, as depicted in FIG. 6B. Additionally, another MEMS component 636 is included above the plane including MEMS components 602 and 604 and the ASIC 608, i.e., the MEMS component 636 is also stacked. In one such embodiment, MEMS component 636 is stacked on the ASIC 608 with a cap layer 660/buffer layer 610 pairing or, alternatively (as shown), with only a buffer layer 610C disposed there between. Referring again to FIG. 6B, a rigid mold compound 614 is disposed over the MEMS components 602, 604, 634 and 636 and the ASIC 608. Thus, an eWLB assembly process may be performed, a general example of which is described in greater detail below. The MEMS components 602, 604, 634 and 636 can be of a same or different type, examples of which are described in greater detail below.

Figure 7:
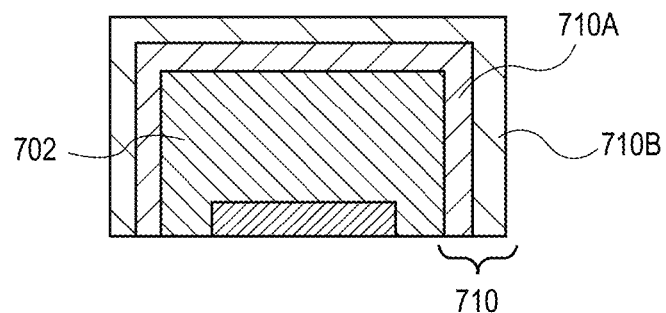
FIG. 7 illustrates a cross-sectional view of a MEMS component having a dual layer buffer layer disposed thereon, in accordance with an embodiment of the present invention.

In a sixth aspect, a stress buffer layer may be composed of more than a single layer of material. As an example, FIG. 7 illustrates a cross-sectional view of a MEMS components having a dual layer buffer layer disposed thereon, in accordance with an embodiment of the present invention. Referring to FIG. 7, a MEMS component, 702 has disposed thereon (and, possibly, partially surrounding) a buffer layer 710 composed of a first layer 710A and a second layer 710B. In one such embodiment, a stress buffer layer for a MEMS component is provided to have combined functions. For example, in a specific embodiment, such a double stack buffer as depicted in FIG. 7 enables the combined functions of buffering mechanical stress (e.g., by layer 710A) as well as provides electrical shielding (e.g., by layer 710B). In such an embodiment, then, a buffer layer can overtake multiple functions, e.g. stress buffering and electrical shielding.

Figure 8:
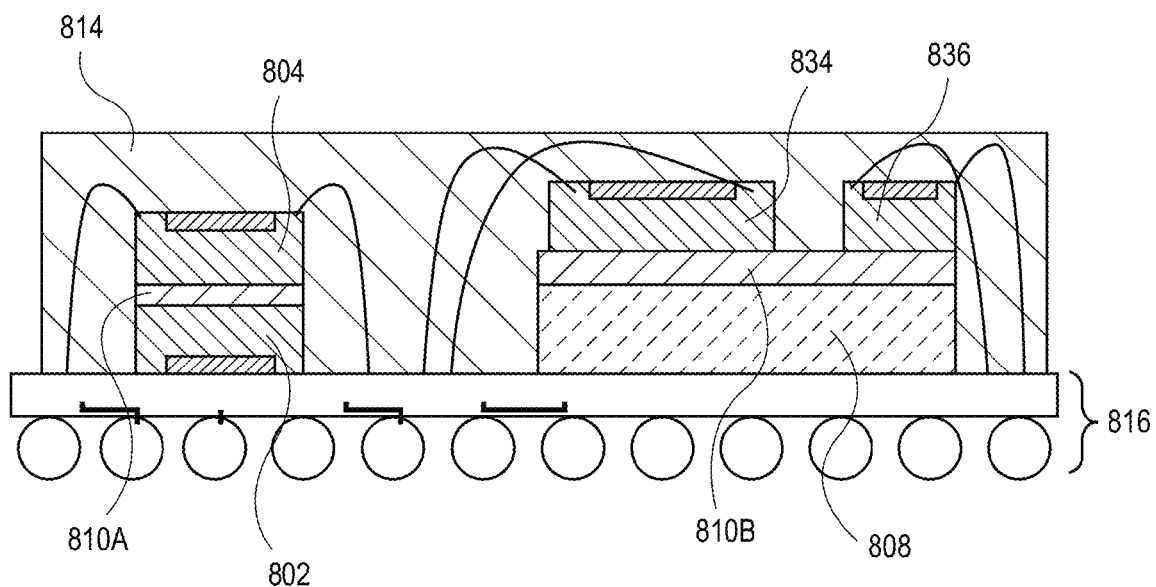
FIG. 8 illustrates a cross-sectional view of a package including a MEMS device and having package-on package (PoP) components, in accordance with another embodiment, of the present invention.

In a seventh aspect, buffer layers may be used in other packages such as flip chip package-on-package (PoP) with a wire bond stacking approach. As an example, FIG. 8 illustrates a cross-sectional view of a package including a MEMS device and having PoP components, in accordance with another embodiment, of the present invention. Referring to FIG. 8, a MEMS component 802 and other components such as an application-specific integrated circuit (ASIC) 808 are disposed on a ball grid array (BGA) substrate 816 or like receiving structure. A second MEMS component 804 is disposed above the MEMS component 802, with an intervening buffer layer 810A. The MEMS component 802 is flip chip bonded to the BGA substrate 816, while the MEMS component 804 is wire-bonded to the BGA substrate 816. Likewise, additional MEMS components 834 and 836 are disposed above the ASIC 808, with an intervening buffer layer 810B. The ASIC 808 is flip chip bonded to the BGA substrate 816, while the MEMS components 834 and 836 are wire-bonded to the BGA substrate 816. Referring again to FIG. 8, a rigid mold compound 814 is disposed over the MEMS components 802, 804, 834 and 836 and the ASIC 808. Thus, an eWLB assembly process may be performed, a general example of which is described in greater detail below. The MEMS components 802, 804, 834 and 836 can be of a same or different type, examples of which are described in greater detail below.

In general, with reference to the above described embodiments, eWLB is a further development of the classical wafer level ball grid array technology (WLB or WLP: wafer level package). A significant driving force behind the eWLB technology is to allow fanout and more space for interconnect routing. Most, if not all, process operations for generation of the package are performed on the wafer. This allows, in comparison to classical packaging technologies (e.g., standard ball grid array), the generation of very small and flat packages with excellent electrical and thermal performance at lowest cost. It is common for all WLB technologies, which are built on a silicon wafer, that the interconnects (e.g., typically solder balls) fit on the chip in a so called fan-in design. Therefore only chips with a restricted number of interconnects can typically be packaged.

Figure 9A:
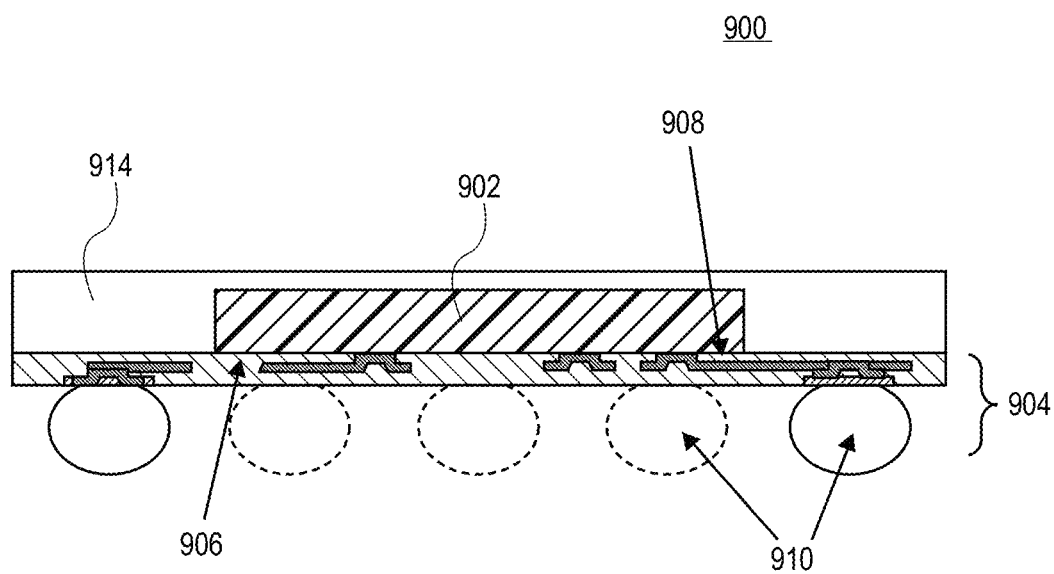
FIG. 9A is a cross-sectional view illustrating generic components of eWLB packaging.
Figure 9B:
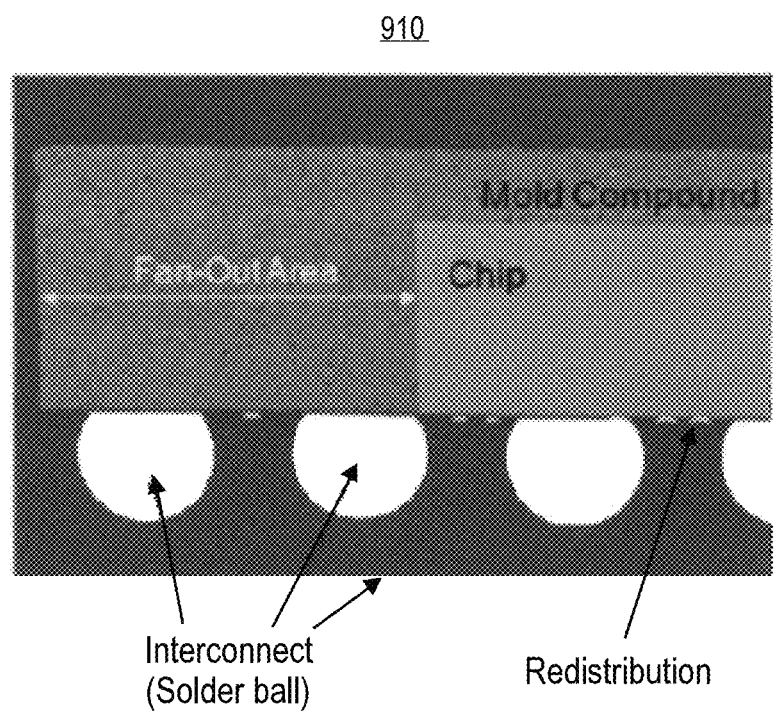
FIG. 9B is an image of a portion of a structure such as is illustrated in FIG. 9A.

FIG. 9A is a cross-sectional view illustrating generic components of eWLB packaging for use with the above described embodiments. Referring to FIG. 9A, an eWLB package 900 includes a chip 902 flip chip bonded to a BGA substrate 904. The BGA substrate 904 includes a dielectric 906, redistribution routing 908 and interconnects such as solder balls 910 having optional locations. A mold frame 914 (or fan-out area) embeds the chip 902. FIG. 9B is an image 920 of a portion of a structure such as is illustrated in FIG. 9A.

With reference to the above described embodiments, eWLB technology allows the realization of chips with a high number of interconnects. The package may not realized on a silicon wafer as for a classical wafer level package, but on an artificial wafer. Therefore, a front-end-processed wafer is diced and the singulated chips are placed on a carrier. The distance between the chips can be chosen freely, but it is typically larger than on the silicon wafer. The gaps and the edges around the chips are filled with a casting compound to form a wafer. After curing an artificial wafer containing a mold frame around the dies for carrying additional interconnect elements is realized. Subsequent to building the artificial wafer (also referred to as reconstitution) the electrical connections from the chip pads to the interconnects are made. Any number of additional interconnects can be realized on the package in an arbitrary distance (e.g., by fan-out design). Typical process operation for eWLB include, but are not limited to or need not be inclusive of, lamination of foil onto a carrier, chip placement onto a wafer (e.g., using a pick and place tool), molding using a mold press), de-bonding of carrier, flipping of a reconstructed wafer, followed by ball drop reflow and wafer test. In accordance with an embodiment of the present invention, a buffer layer is applied to some or all components included in an eWLB packaging process prior to or during the eWLB packaging process. Advantages of applying eWLB technology in scenarios such as the above described embodiments include, but need not be limited to, low cost (package and test) where a minimal lateral package size and height is used, excellent electrical and thermal properties, the number of realizable interconnects on the package is not restricted, high integration potential for multi-die- and stacked packages.

With reference again to the above described embodiments, the term "MEMS" generally refers to an apparatus incorporating some mechanical structure having a dimensional scale that is comparable to microelectronic devices. The mechanical structure is typically capable of some form of mechanical motion and having dimensions below approximately 250 microns; however, some embodiments may include MEMS sensors that are a few millimeters across a package. Thus, MEMS structures contemplated herein are, in an embodiment, any device that falls within the scope of MEMS technologies. For example, a MEMS structure may be any mechanical and electronic structure having a critical dimension of less than approximately 250 microns and fabricated using lithography, deposition, and etching processes above a substrate. In accordance with an embodiment of the present invention, the MEMS structure is a device such as, but not limited to, a resonator, a sensor, a detector, a filter or a mirror. In one embodiment, the MEMS structure is a resonator. In a specific embodiment, the resonator is one such as, but not limited to, a beam, a plate and a tuning fork or a cantilever arm.

With reference again to the above described embodiments, an active surface of a packaged semiconductor die, such as the above described ASIC components, includes a plurality of semiconductor devices, such as but not limited to transistors, capacitors and resistors interconnected together by a die interconnection structure into functional circuits to thereby form an integrated circuit. As will be understood to those skilled in the art, the device side of the semiconductor die includes an active portion with integrated circuitry and interconnections. The semiconductor die may be any appropriate integrated circuit device including but not limited to a microprocessor (single or multi-core), a memory device, a chipset, a graphics device, an application specific integrated circuit according to several different embodiments. In another embodiment, more than one die is embedded in the same package. For example, in one embodiment, a packaged semiconductor die further includes a secondary stacked die. The first die may have one or more through-silicon vias disposed therein (TSV die). The second die may be electrically coupled to the TSV die through the one or more through-silicon vias.

As mentioned briefly above, an array of external conductive contacts may be included, such as a ball grid array. In an embodiment, the external conductive contacts couple the formed substrate to a foundation substrate. The external conductive contacts may be used for electrical communication with the foundation substrate. In one embodiment, the array of external conductive contacts is a ball grid array (BGA). In other embodiments, the array of external conductive contacts is an array such as, but not limited to, a land grid array (LGA) or an array of pins (PGA).

In an alternative embodiments, a bumpless build-up layer (BBUL) packaging scheme is used to house MEMS components having an associated stress buffer layer. One or more embodiments described herein are directed to semiconductor packages having one or more microelectromechanical systems (MEMS) structures incorporated therein. In one such embodiment, a MEMS device or die is packaged using build-up layers. In general, BBUL is a processor packaging technology that is bumpless since it does not use the usual small solder bumps to attach the silicon die to the processor package wires. It has build-up layers since it is grown or built-up around the silicon die. Some semiconductor packages now use a coreless substrate, which does not include the thick resin core layer commonly found in conventional substrates. In an embodiment, as part of the BBUL process, electrically conductive vias and routing layers are formed above the active side of a semiconductor die using a semi-additive process (SAP) to complete remaining layers.

Embodiments of the present invention may be suitable for fabricating a system on a chip (SOC), e.g., for a smartphone or a tablet. In an embodiment, an MEMS component is integrated and fabricated in an eWLB packaging fab. Alternatively, the process flow for die integration with MEMS may be applicable to other packaging substrate technologies, such as BBUL as described above.

Figure 10:
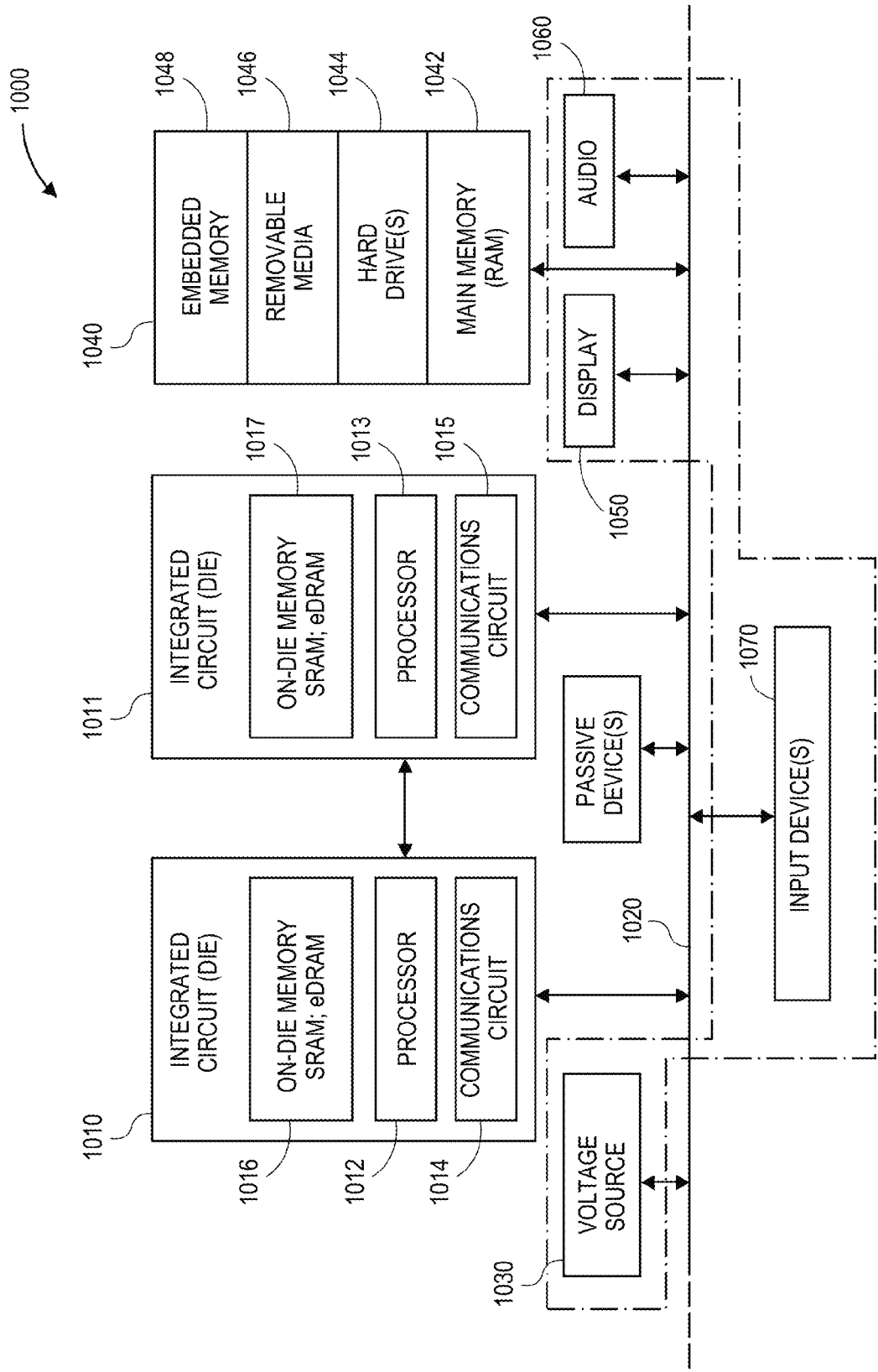
FIG. 10 is a schematic of a computer system, in accordance with an embodiment of the present invention.

FIG. 10 is a schematic of a computer system 1000, in accordance with an embodiment of the present invention. The computer system 1000 (also referred to as the electronic system 1000) as depicted can embody a semiconductor package having one or more MEMS devices according to any of the several disclosed embodiments and their equivalents as set forth in this disclosure. The computer system 1000 may be a mobile device such as a netbook computer. The computer system 1000 may be a mobile device such as a wireless smart phone. The computer system 1000 may be a desktop computer. The computer system 1000 may be a hand-held reader. The computer system 1000 may be a watch.

In an embodiment, the electronic system 1000 is a computer system that includes a system bus 1020 to electrically couple the various components of the electronic system 1000. The system bus 1020 is a single bus or any combination of busses according to various embodiments. The electronic system 1000 includes a voltage source 1030 that provides power to the integrated circuit 1010. In some embodiments, the voltage source 1030 supplies current to the integrated circuit 1010 through the system bus 1020.

The integrated circuit 1010 is electrically coupled to the system bus 1020 and includes any circuit, or combination of circuits according to an embodiment. In an embodiment, the integrated circuit 1010 includes a processor 1012 that can be of any type. As used herein, the processor 1012 may mean any type of circuit such as, but not limited to, a microprocessor, a microcontroller, a graphics processor, a digital signal processor, or another processor. In an embodiment, the processor 1012 includes or is included in a semiconductor package having one or more MEMS devices, as disclosed herein. In an embodiment, SRAM embodiments are found in memory caches of the processor. Other types of circuits that can be included in the integrated circuit 1010 are a custom circuit or an application-specific integrated circuit (ASIC), such as a communications circuit 1014 for use in wireless devices such as cellular telephones, smart phones, pagers, portable computers, two-way radios, and similar electronic systems. In an embodiment, the processor 1010 includes on-die memory 1016 such as static random-access memory (SRAM). In an embodiment, the processor 1010 includes embedded on-die memory 1016 such as embedded dynamic random-access memory (eDRAM).

In an embodiment, the integrated circuit 1010 is complemented with a subsequent integrated circuit 1011. Useful embodiments include a dual processor 1013 and a dual communications circuit 1015 and dual on-die memory 1017 such as SRAM. In an embodiment, the dual integrated circuit 1010 includes embedded on-die memory 1017 such as eDRAM.

In an embodiment, the electronic system 1000 also includes an external memory 1040 that in turn may include one or more memory elements suitable to the particular application, such as a main memory 1042 in the form of RAM, one or more hard drives 1044, and/or one or more drives that handle removable media 1046, such as diskettes, compact disks (CDs), digital variable disks (DVDs), flash memory drives, and other removable media known in the art. The external memory 1040 may also be embedded memory 1048 such as the first die in an embedded TSV die stack, according to an embodiment.

In an embodiment, the electronic system 1000 also includes a display device 1050 and an audio output 1060. In an embodiment, the electronic system 1000 includes an input device such as a controller 1070 that may be a keyboard, mouse, trackball, game controller, microphone, voice-recognition device, or any other input device that inputs information into the electronic system 1000. In an embodiment, an input device 1070 is a camera. In an embodiment, an input device 1070 is a digital sound recorder. In an embodiment, an input device 1070 is a camera and a digital sound recorder.

As shown herein, the integrated circuit 1010 may be implemented in a number of different embodiments, including a semiconductor package having one or more MEMS devices according to any of the several disclosed embodiments and their equivalents, an electronic system, a computer system, one or more methods of fabricating an integrated circuit, and one or more methods of fabricating an electronic assembly that includes a semiconductor package having one or more MEMS devices according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed semiconductor package having one or more MEMS devices embodiments and their equivalents. A foundation substrate may be included, as represented by the dashed line of FIG. 10. Passive devices may also be included, as is also depicted in FIG. 10.

Embodiments of the present invention include stress buffer layers for integrated microelectromechanical systems (MEMS).

In an embodiment, a semiconductor package includes a substrate having first and second surfaces, the second surface having an array of external conductive contacts. A microelectromechanical system (MEMS) component is disposed above the first surface of the substrate. A buffer layer is disposed above the MEMS component, the buffer layer having a first Young's modulus. A mold compound is disposed above the buffer layer, the mold compound having a second Young's modulus higher than the first Young's modulus.

In one embodiment, the first Young's modulus is approximately 5 GPa or less, and the second Young's modulus is approximately 25 GPa.

In one embodiment, the buffer layer is composed of a material such as, but not limited to, a polyimide, an epoxy, an epoxy blend or a silicone.

In one embodiment, the buffer layer is disposed directly on the MEMS component.

In one embodiment, the semiconductor package further includes a second MEMS component disposed above the first surface of the substrate, adjacent the MEMS component. A semiconductor die is disposed above the first surface of the substrate, adjacent the second MEMS component. The buffer layer is a continuous buffer layer disposed on at least partially surrounding each of the MEMS component, the second MEMS component and the semiconductor die.

In one embodiment, the semiconductor package further includes a third MEMS component disposed above the second MEMS component. The buffer layer has an opening to expose a portion of the semiconductor die. The third MEMS component is electrically coupled to the semiconductor die through the opening.

In one embodiment, the semiconductor package further includes a second MEMS component disposed above the first surface of the substrate, adjacent the MEMS component. A semiconductor die is disposed above the first surface of the substrate, adjacent the second MEMS component. The buffer layer is a continuous buffer layer disposed on at least partially surrounding both the MEMS component and the second MEMS component, but not the semiconductor die.

In one embodiment, the semiconductor package further includes a second MEMS component disposed above the first surface of the substrate, adjacent the MEMS component. A semiconductor die is disposed above the first surface of the substrate, adjacent the second MEMS component. The buffer layer includes a first portion disposed on at least partially surrounding the MEMS component, a second portion disposed on at least partially surrounding the second MEMS component, and a third portion disposed on at least partially surrounding the semiconductor die. The first, second, and third portions of the buffer layer are discrete from one another.

In one embodiment, the semiconductor package further includes a cap layer disposed directly between the buffer layer and the MEMS component.

In one embodiment, the buffer layer is composed of a first material layer and a second, different material layer.

In one embodiment, the first material layer is a stress reducing layer and the second material layer is an electrical shielding layer.

In one embodiment, the array of external conductive contacts is a ball grid array (BGA).

In one embodiment, the semiconductor package is an embedded wafer level BGA (eWLB) package.

In an embodiment, a method of fabricating a semiconductor package involves placing a MEMS component on a carrier substrate. The method also involves forming a buffer layer over the MEMS component and the carrier substrate, the buffer layer having a first Young's modulus. The method also involves forming a mold compound over the buffer layer and the carrier substrate, the mold compound having a second Young's modulus higher than the first Young's modulus. The method also involves transferring the MEMS component, the buffer layer, and the mold compound from the carrier substrate to a substrate having an array of external conductive contacts.

In one embodiment, forming the buffer layer involves forming a material such as, but not limited to, a polyimide, an epoxy, an epoxy blend or a silicone.

In one embodiment, forming the buffer layer involves forming the buffer layer directly on the MEMS component.

In one embodiment, transferring the MEMS component, the buffer layer, and the mold compound from the carrier substrate to the substrate having the array of external conductive contacts involves transferring to a ball grid array (BGA) substrate.

In one embodiment, the first Young's modulus is approximately 5 GPa or less, and the second Young's modulus is approximately 25 GPa.

In an embodiment, a method of fabricating a semiconductor package involves forming a buffer layer over a MEMS component, the buffer layer having a first Young's modulus. The method also involves placing the MEMS component having the buffer layer on a carrier substrate. The method also involves forming a mold compound over the buffer layer and the carrier substrate, the mold compound having a second Young's modulus higher than the first Young's modulus. The method also involves transferring the MEMS component, the buffer layer, and the mold compound to a substrate having an array of external conductive contacts.

In one embodiment, forming the buffer layer involves forming a material such as, but not limited to, a polyimide, an epoxy, an epoxy blend or a silicone.

In one embodiment, forming the buffer layer involves forming the buffer layer directly on the MEMS component.

In one embodiment, transferring the MEMS component, the buffer layer, and the mold compound from the carrier substrate to the substrate having the array of external conductive contacts involves transferring to a ball grid array (BGA) substrate.

In one embodiment, the first Young's modulus is approximately 5 GPa or less, and the second Young's modulus is approximately 25 GPa.

What is claimed is:

1. A semiconductor package, comprising:
    a substrate comprising first and second surfaces, the second surface comprising an array of external conductive contacts;
    a microelectromechanical system (MEMS) component disposed above the first surface of the substrate;
    a buffer layer disposed above the MEMS component, the buffer layer having a first Young's modulus;
    a cap layer disposed directly between the buffer layer and the MEMS component; and
    a mold compound disposed above the buffer layer, the mold compound having a second Young's modulus higher than the first Young's modulus.

2. The semiconductor package of claim 1, wherein the first Young's modulus is approximately 5 GPa or less, and the second Young's modulus is approximately 25 GPa.

3. The semiconductor package of claim 1, wherein the buffer layer comprises a material selected from the group consisting of a polyimide, an epoxy, an epoxy blend and a silicone.

4. The semiconductor package of claim 1, further comprising:
    a second MEMS component disposed above the first surface of the substrate, adjacent the MEMS component; and
    a semiconductor die disposed above the first surface of the substrate, adjacent the second MEMS component, wherein the buffer layer is a continuous buffer layer disposed on and at least partially surrounding each of the MEMS component, the second MEMS component and the semiconductor die.

5. The semiconductor package of claim 4, further comprising:
    a third MEMS component disposed above the second MEMS component, wherein the buffer layer comprises an opening to expose a portion of the semiconductor die, and wherein the third MEMS component is electrically coupled to the semiconductor die through the opening.

6. The semiconductor package of claim 1, further comprising:
    a second MEMS component disposed above the first surface of the substrate, adjacent the MEMS component; and
    a semiconductor die disposed above the first surface of the substrate, adjacent the second MEMS component, wherein the buffer layer is a continuous buffer layer disposed on and at least partially surrounding both the MEMS component and the second MEMS component, but not the semiconductor die.

7. The semiconductor package of claim 1, further comprising:
- a second MEMS component disposed above the first surface of the substrate, adjacent the MEMS component; and
- a semiconductor die disposed above the first surface of the substrate, adjacent the second MEMS component, wherein the buffer layer comprises a first portion disposed on and at least partially surrounding the MEMS component, a second portion disposed on and at least partially surrounding the second MEMS component, and a third portion disposed on and at least partially surrounding the semiconductor die, the first, second, and third portions of the buffer layer discrete from one another.

8. The semiconductor package of claim 1, wherein the buffer layer comprises a first material layer and a second, different material layer.

9. The semiconductor package of claim 8, wherein the first material layer is a stress reducing layer and the second material layer is an electrical shielding layer.

10. The semiconductor package of claim 1, wherein the array of external conductive contacts is a ball grid array (BGA).

11. The semiconductor package of claim 10, wherein the semiconductor package is an embedded wafer level BGA (eWLB) package.

12. A semiconductor package, comprising:
- a substrate comprising first and second surfaces, the second surface comprising an array of external conductive contacts;
- a microelectromechanical system (MEMS) component disposed above the first surface of the substrate, a second MEMS component disposed above the first surface of the substrate adjacent the MEMS component, and a semiconductor die disposed above the first surface of the substrate adjacent the second MEMS component;
- a buffer layer disposed above the MEMS component, the buffer layer having a first Young's modulus, wherein the buffer layer is a continuous buffer layer disposed on and at least partially surrounding each of the MEMS component, the second MEMS component and the semiconductor die;
- a third MEMS component disposed above the second MEMS component, wherein the buffer layer comprises an opening to expose a portion of the semiconductor die, and wherein the third MEMS component is electrically coupled to the semiconductor die through the opening; and
- a mold compound disposed above the buffer layer, the mold compound having a second Young's modulus higher than the first Young's modulus.

13. The semiconductor package of claim 12, wherein the first Young's modulus is approximately 5 GPa or less, and the second Young's modulus is approximately 25 GPa.

14. The semiconductor package of claim 12, wherein the buffer layer comprises a material selected from the group consisting of a polyimide, an epoxy, an epoxy blend and a silicone.

15. The semiconductor package of claim 12, wherein the buffer layer is disposed directly on the MEMS component.

16. The semiconductor package of claim 12, wherein the buffer layer comprises a first material layer and a second, different material layer.

17. The semiconductor package of claim 16, wherein the first material layer is a stress reducing layer and the second material layer is an electrical shielding layer.

18. The semiconductor package of claim 12, wherein the array of external conductive contacts is a ball grid array (BGA).

19. The semiconductor package of claim 18, wherein the semiconductor package is an embedded wafer level BGA (eWLB) package.

20. A semiconductor package, comprising:
- a substrate comprising first and second surfaces, the second surface comprising an array of external conductive contacts;
- a microelectromechanical system (MEMS) component disposed above the first surface of the substrate, a second MEMS component disposed above the first surface of the substrate adjacent the MEMS component, and a semiconductor die disposed above the first surface of the substrate adjacent the second MEMS component;
- a buffer layer disposed above the MEMS component, the buffer layer having a first Young's modulus, wherein the buffer layer is a continuous buffer layer disposed on and at least partially surrounding both the MEMS component and the second MEMS component, but not the semiconductor die; and
- a mold compound disposed above the buffer layer, the mold compound having a second Young's modulus higher than the first Young's modulus.

21. The semiconductor package of claim 20, wherein the first Young's modulus is approximately 5 GPa or less, and the second Young's modulus is approximately 25 GPa.

22. The semiconductor package of claim 20, wherein the buffer layer comprises a material selected from the group consisting of a polyimide, an epoxy, an epoxy blend and a silicone.

23. The semiconductor package of claim 20, wherein the buffer layer is disposed directly on the MEMS component.

24. The semiconductor package of claim 20, wherein the buffer layer comprises a first material layer and a second, different material layer.

25. The semiconductor package of claim 24, wherein the first material layer is a stress reducing layer and the second material layer is an electrical shielding layer.

26. The semiconductor package of claim 20, wherein the array of external conductive contacts is a ball grid array (BGA).

27. The semiconductor package of claim 26, wherein the semiconductor package is an embedded wafer level BGA (eWLB) package.

28. A semiconductor package, comprising:
- a substrate comprising first and second surfaces, the second surface comprising an array of external conductive contacts;
- a microelectromechanical system (MEMS) component disposed above the first surface of the substrate, a second MEMS component disposed above the first surface of the substrate adjacent the MEMS component, and a semiconductor die disposed above the first surface of the substrate adjacent the second MEMS component;
- a buffer layer disposed above the MEMS component, the buffer layer having a first Young's modulus, wherein the buffer layer comprises a first portion disposed on and at least partially surrounding the MEMS component, a second portion disposed on and at least partially surrounding the second MEMS component, and a third portion disposed on and at least partially surrounding the semiconductor die, the first, second, and third portions of the buffer layer discrete from one another; and a mold compound disposed above the buffer layer, the mold compound having a second Young's modulus higher than the first Young's modulus.

29. The semiconductor package of claim 28, wherein the first Young's modulus is approximately 5 GPa or less, and the second Young's modulus is approximately 25 GPa.

30. The semiconductor package of claim 28, wherein the buffer layer comprises a material selected from the group consisting of a polyimide, an epoxy, an epoxy blend and a silicone.

31. The semiconductor package of claim 28, wherein the buffer layer is disposed directly on the MEMS component.

32. The semiconductor package of claim 28, wherein the buffer layer comprises a first material layer and a second, different material layer.

33. The semiconductor package of claim 32, wherein the first material layer is a stress reducing layer and the second material layer is an electrical shielding layer.

34. The semiconductor package of claim 28, wherein the array of external conductive contacts is a ball grid array (BGA).

35. The semiconductor package of claim 34, wherein the semiconductor package is an embedded wafer level BGA (eWLB) package.

* * * * *